United States Patent [19]

May et al.

[11] Patent Number: 5,893,466
[45] Date of Patent: Apr. 13, 1999

[54] SUPPORT FOR PRINTED CIRCUIT BOARD DURING PROCESSING

[75] Inventors: Kai-Pin Arthur May, Cupertino; Paul D. Welch, Milpitas, both of Calif.

[73] Assignee: Sun Microsystems, Inc., Mountain View, Calif.

[21] Appl. No.: 08/883,826

[22] Filed: Jun. 27, 1997

[51] Int. Cl.$^6$ ............................................. A47G 19/08
[52] U.S. Cl. ............................................. 211/41.17
[58] Field of Search ........................ 211/41.17, 41.1; 361/748, 760

[56] References Cited

U.S. PATENT DOCUMENTS

| | | | |
|---|---|---|---|
| 5,033,627 | 7/1991 | Brown | 211/41.17 |
| 5,156,280 | 10/1992 | Joist | 211/41.17 |
| 5,170,894 | 12/1992 | Joist et al. | 211/41.17 |
| 5,434,746 | 7/1995 | Testa et al. | 211/41.17 |
| 5,499,163 | 3/1996 | Sonntag et al. | 211/41.17 |

*Primary Examiner*—Alvin Chin-Shue
*Assistant Examiner*—Sarah Purol
*Attorney, Agent, or Firm*—Julian Caplan Flehr Hohbach Test Albritton & Herbert LLP

[57] ABSTRACT

During processing, such as wave soldering, it is necessary to support a printed circuit board (PCB) above a pallet or carrier without sagging. A support rod has hooks which fit through holes in the PCB and engage the margins of the holes. Ends of the rod are provided with second hooks which engage the pallet or carrier to support the rod above the pallet and thereby support the PCB. Preferably the rod is multi-sectional and spring biased so that the hooks may be conveniently installed in the holes.

14 Claims, 4 Drawing Sheets

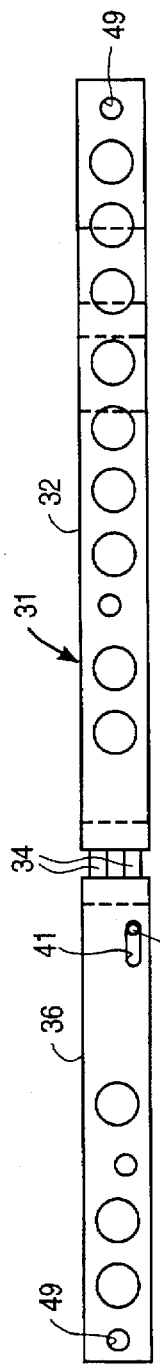
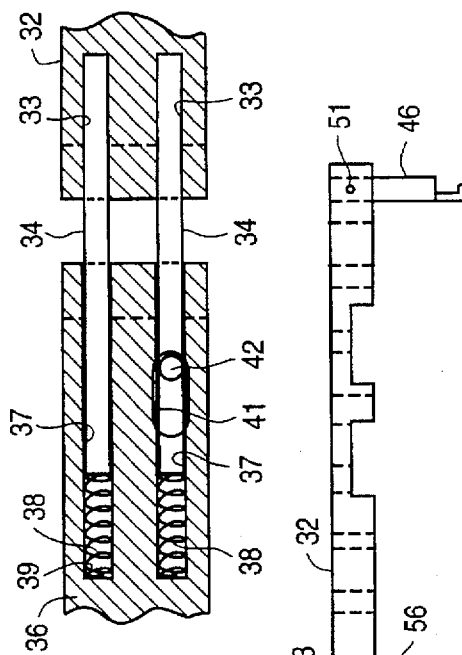
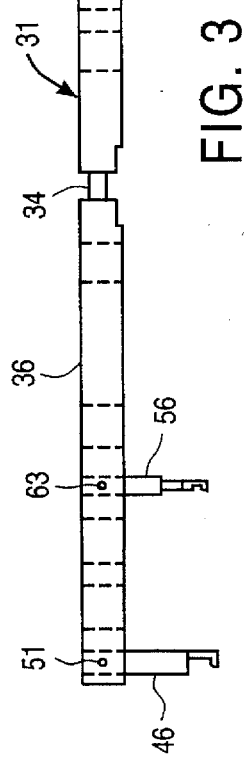
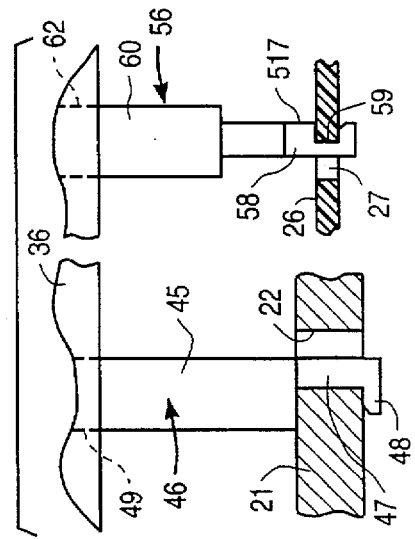

SUPPORT FOR PRINTED CIRCUIT BOARD DURING PROCESSING

BACKGROUND OF THE INVENTION

1. Field of the Invention

This invention relates to a new and improved support for a printed circuit board (PCB) during processing, such as during wave soldering. More particularly the invention relates to a rod which engages and is supported above the pallet or carrier for the PCB. The rod has several hooks which extend downward and fit through holes in the PCB and thereby support the PCB above the pallet and below the rod.

2. Description of Related Art

Prior supports of this general nature employ a rod having mounting brackets at the ends thereof to support the rod above a pallet. Depending from the rod are posts which engage the PCB. Prior supports have a number of problems. The posts which depend from the rod are fixed longitudinally of the rod and are turned for locking purposes. In line holes are required to be made in the PCB to receive the fixed posts and this requires that the designer locate the holes, thereby interfering with the flexibility of the design of the PCB. Turning the rod during application raises the possibility of scratching the bottom of the PCB near the hole through which the rod is inserted. This type of design may even leave a dent around the hole. In some cases solder bridgings may occur due to sagging which may occur during a wave soldering thermal process.

SUMMARY OF THE INVENTION

Most PCBs are made of a fiber-reinforced resin dielectric material and even relatively low temperatures weaken the PCB during the soldering process and cause downward sagging, especially when the PCB is loaded with components. In order to support the PCB, in the past a supporting metal post or posts may be mounted at fixed locations and on occasions a permanent metal stiffener is mounted on the PCB during soldering.

When the PCB sags it is damaged and a scratch mark or dented surface is created and there tend to be more solder bridging defects.

The present invention provides a support for the PCB during soldering or any related heat/thermal curing processes. The provision of large slot openings in the PCB design is unnecessary. In accordance with the present invention existing hardware holes such as clip or screw mounting holes are required with offset centered supporting hooks to engage the PCB and provide necessary locking and supporting mechanism.

The present invention preferably employs a metal rod divided into two parts which are spring loaded and provided with supporting hooks which engage holes in the PCB and further employ hooks which engage the pallet or carrier for the PCB during wave soldering and other processes commonly used in PCB production. The operator compresses the rod against the force of springs and then positions the supporting hooks which depend from the rod through non-plated holes in the PCB. Upon release of the rod, the hooks lock into place. The supporting metal hooks may be located at various places along the length of the rod corresponding to the location of existing hardware mounting holes or predesigned tooling holes.

In one of the forms of the present invention the supporting hooks may be offset from the center line of the rod for convenience in the design of the PCB.

A further feature of the invention is the fact that no additional fastening hardware is required.

BRIEF DESCRIPTION OF THE DRAWINGS

The accompanying drawings, which are incorporated in and form a part of this specification, illustrate embodiments of the invention and, together with the description serve to explain the principles of the invention.

FIG. 2 is a top plan view of a support.

FIG. 2A is a fragmentary sectional view of a portion of FIG. 2.

FIG. 3 is a side elevational view of the support of FIG. 2.

FIG. 3A is a sectional view taken substantially above the line 3A—3A of FIG. 2A.

FIG. 3B is an enlarged fragmentary view of a portion of FIG. 3.

DESCRIPTION OF THE PREFERRED EMBODIMENT

Figure 1:
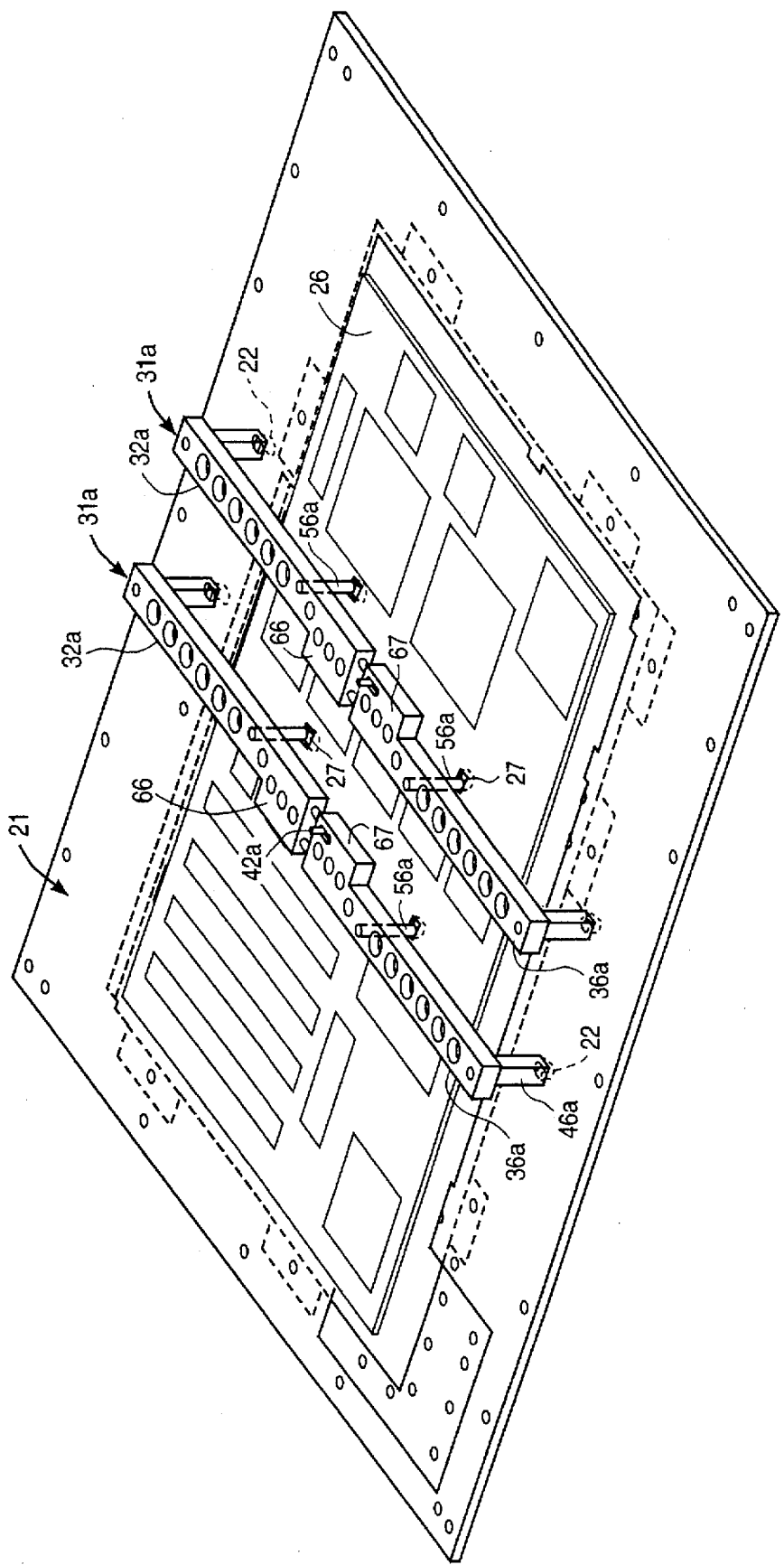
FIG. 1 is a perspective view of the invention installed to support a PCB above a pallet.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

A pallet 21 having elongated holes 22 located adjacent end edges is commonly used to support a PCB 26 during wave soldering and other processing where the PCB may tend to sag. Holes 27 designed for other purposes or specially created at locations which do not otherwise interfere with the design of the PCB are formed in the PCB.

A support rod 31 preferably by titanium ASTM B348 grade 2 (illustrated in FIGS. 2–3B) is apertured along its length for weight reduction. Rod 31 consists of two sections. Section one 32 is formed with two horizontal longitudinal holes 33 therein. Press fit into holes 33 and extending out the end of rod 31 are dowels 34. Preferably dowels 34 are formed of an aluminum alloy such as ASTM B221-93, aluminum 6061-T6511.

Section two 36, which is spaced from but is otherwise in line with section 32, is formed with holes 37 extending longitudinally and spaced the same distance as holes 33. A spring 38 is positioned in a spring pocket 39 at the inner ends of each of the holes 37. An elongated slot 41 extends from the top surface of section 36 to hole 37 and a pin 42 fixed to dowel 34 extends up through slot 41. The length of slot 41 limits movement of sections 32 and 36 toward and away from each other.

Adjacent the outer ends of sections 32 and 36 are end hooks 46, each having a cylindrical upper end 45 from which depends a leg 47 terminating in a foot 48. Upper end 45 fits through a vertical hole 49 in section 32 or 36. Roll pin 51 adjustably holds the leg 47 in place to adjust the height of the rod 31 above the supporting surface. End hooks 46 are spaced from each other in relationship to the holes 22 in pallet 21. By pressing the sections 32 and 36 together the feet 48 may be inserted through holes 22 and the bottoms of legs 47 engage the top surface of pallet 21, thereby supporting the rod 31 a fixed distance above the pallet.

Intermediate hooks 56 are also provided each having leg 57 which fits into a hole 27 in the PCB. The upper end of leg 57 is a cylindrical member 60 to slide in hole 62 and to be fixed in position by roll pin 63 so that the PCB 26 is supported a desired distance below rod 31 and above pallet 21. The lower end of leg 57 is formed with a flat 58 and an edge of flat 58 is formed with a notch 59. Flat 58 may be inserted through holes 27 upon compression of sections 32 and 36 together and notch 59 formed therein engages the top and bottom surfaces of the PCB surrounding holes 27.

In operation, the flats 58 are inserted through holes 27 in the PCB and the feet 48 through the holes 22 in the pallet 21. Upon release of the sections 32 and 36, springs 38 extend the hooks 46 away from each other and also extend the hooks 56 away from each other so that the rod 31 grips the pallet 21 and the PCB 26. Holes 27 are factored into the design of PCB 26 so that the insertion of hooks 56 does not interfere with the design of the components of the PCB.

Figure 4:
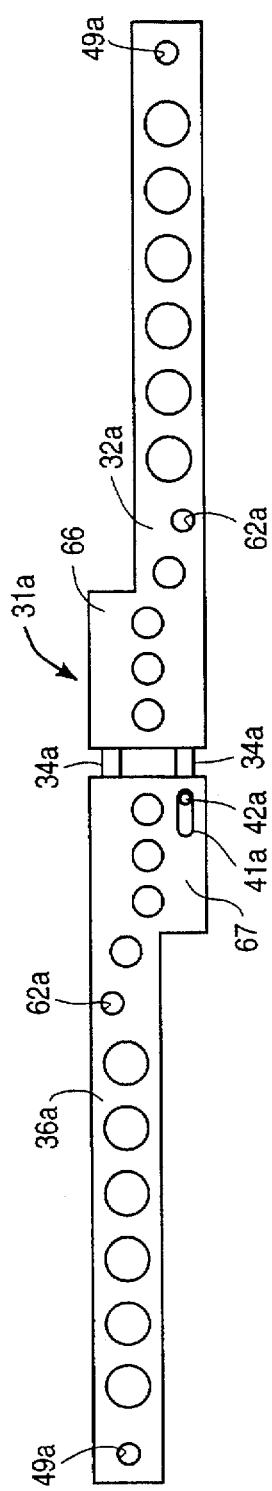
FIG. 4 is a view similar to FIG. 2 of a modified support.
Figure 5:
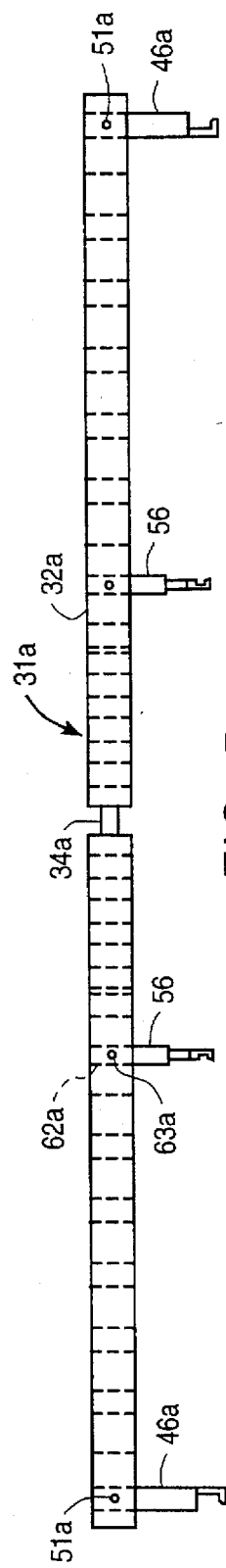
FIG. 5 is a side elevational view of the structure of FIG. 4.
Figure 4A:
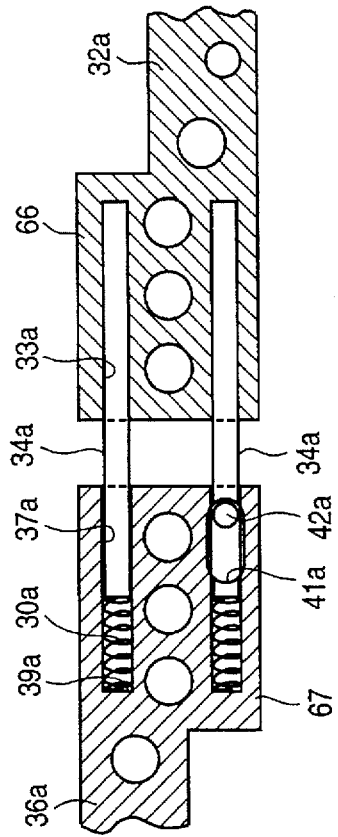
FIG. 4A is a fragmentary sectional view of a portion of FIG. 4.
Figure 6:
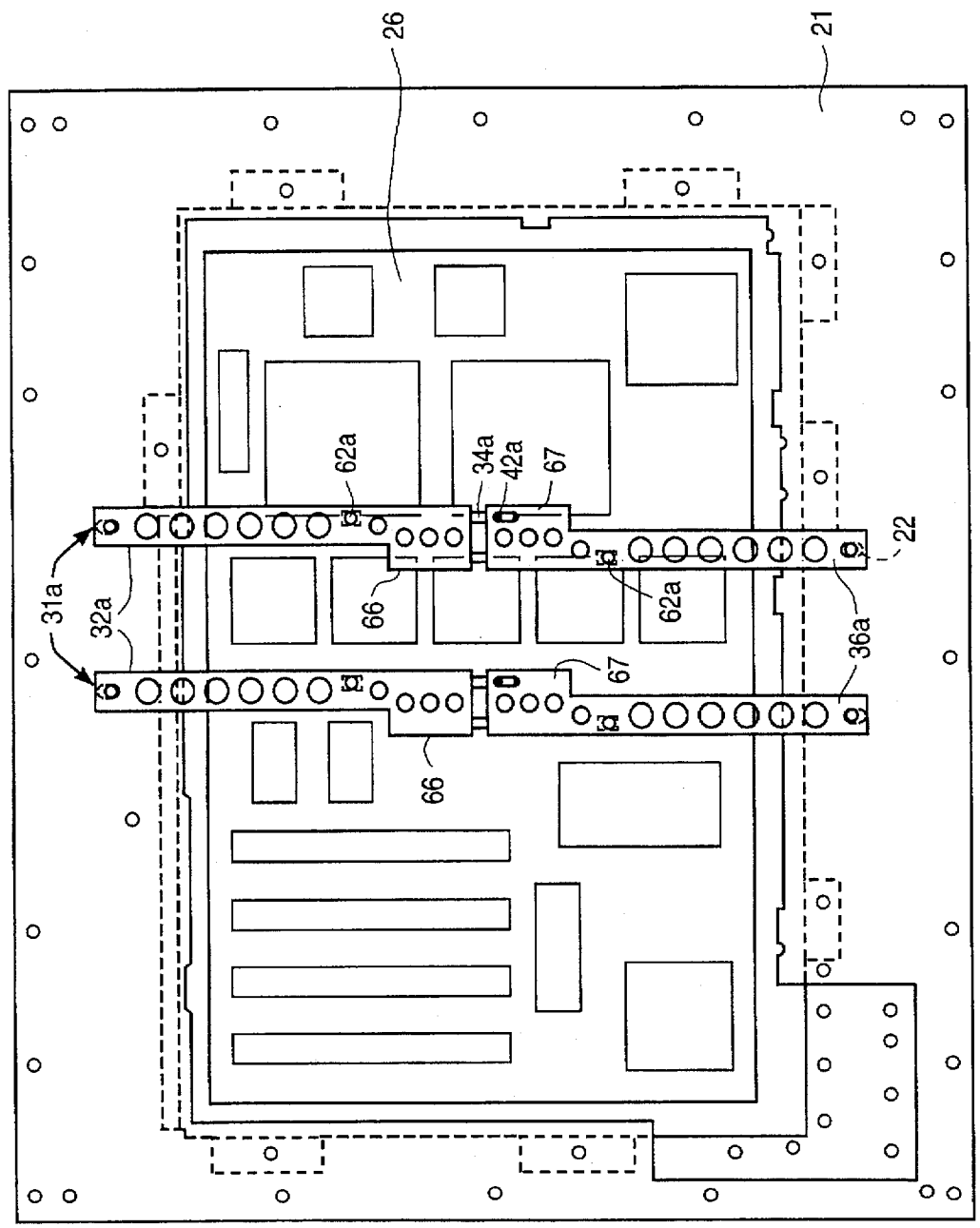
FIG. 6 is a top plan of the structure of FIG. 1.

A modification of the invention is shown in FIGS. 1 and 4–6. It will be seen that rod section 32a is formed with offset 66 and offset 67 in section 36a. In this manner the hooks 56a may be offset from the centerline of rod 31a to provide flexibility in the design of the PCB. In other respects the elements of this modification resemble those of the preceding modification and the same reference numerals followed by subscript a represent corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A support to support a PCB having at least one first hole above a pallet having at least two spaced second holes comprising; a first rod section, a second rod section, a guide extending from a first end of said first rod section, said second rod section formed with a bore in a first end in said second rod section receiving a spring and an end of said guide, said spring biasing said first and second rod sections apart, first and second end hooks secured adjacent second ends of said first and second rod sections, respectively, said end hooks being shaped to engage a pallet to support said rod above said pallet, at least one intermediate hook shaped to engage a PCB to support said PCB from said support above said pallet, said intermediate hook being secured in at least one rod section.

2. A support according to claim 1 having a second guide fixed to extend from a first end of one said rod section and to be received in a second bore in another said rod section.

3. A support according to claim 1 in which said rod sections are aligned.

4. A support according to claim 1 in which said rod sections are parallel and offset relative to each other.

5. A support according to claim 1 in which said second rod section is formed with a longitudinally elongated slot communicating with said bore and which further comprises a pin fixed to said dowel extending into said elongated slot to limit longitudinal movement of said rod sections toward and away from each other.

6. A support according to claim 1 in which each said end hook extends downward from said rod and has a vertical leg below said end hook and a horizontal foot shaped to fit into a second hole in a pallet to support said rod above said pallet.

7. A support according to claim 6 in which said leg is of lesser cross-section than said hook, whereby the end of each said hook is adapted to rest on a pallet and each said foot to engage under said pallet.

8. A support according to claim 7 in which said lesser cross-section is rectangular.

9. A support according to claim 6 in which said end hook has a cylindrical upper end and said rod is apertured to receive said upper end.

10. A support according to claim 9 in which said end hook is vertically adjustable relative to said support.

11. A support according to claim 1 in which said intermediate hook is formed with a cylindrical upper end and said rod is apertured to receive said upper end, said intermediate hook further being formed with a lower end shaped to fit into said first hole and to engage said PCB to support said PCB.

12. A support according to claim 11 in which said lower end is formed with a horizontal notch whereby upper and lower margins of said notch may engage top and bottom surfaces of said PCB.

13. A support according to claim 12 in which said lower end is of lesser cross-section than said upper end.

14. A support according to claim 11 in which said intermediate hook is vertically adjustable relative to said support.

* * * * *